United States Patent [19]

Miyashita et al.

[11] Patent Number: 5,357,121
[45] Date of Patent: Oct. 18, 1994

[54] OPTOELECTRONIC INTEGRATED CIRCUIT

[75] Inventors: Miyo Miyashita; Takayuki Katoh; Teruyuki Shimura; Kazuhiko Nakahara, all of Itami, Japan

[73] Assignee: Mitsubishi Denki Kabushiki Kaisha, Tokyo, Japan

[21] Appl. No.: 944,981

[22] Filed: Sep. 15, 1992

[30] Foreign Application Priority Data

Oct. 14, 1991 [JP] Japan .................. 3-296352

[51] Int. Cl.$^5$ .............. H01L 29/161; H01L 29/205; H01L 29/225; H01L 33/00
[52] U.S. Cl. ........................ 257/79; 257/80; 257/81; 257/82; 257/84
[58] Field of Search .............. 257/79, 80, 81, 82, 257/83, 84, 113, 734, 774

[56] References Cited

U.S. PATENT DOCUMENTS 4,857,746 8/1989 Kuhlmann et al. .............. 257/82

FOREIGN PATENT DOCUMENTS

| 0421404 | 4/1991 | European Pat. Off. . |
| 57-34375 | 2/1982 | Japan . |
| 57-35369 | 2/1982 | Japan . |
| 61-135155 | 6/1986 | Japan . |
| 63-124458 | 5/1988 | Japan . |
| 348430 | 3/1991 | Japan . |

OTHER PUBLICATIONS

Horimatsu et al, "Compact Transmitter And Receiver Modules With Optoelectronic-Integrated Circuits For Optical LAN's", Journal of Lightwave Technology, vol. LT-4, No. 6, Jun. 1986.

Slayman et al, "Frequency And Pulse Response Of A Novel High Speed Interdigital Surface Photoconductor (IDPC)", IEEE Electron Device Letters, vol. EDL-2, No. 5, May 1981, pp. 113-114.

Primary Examiner—Andrew J. James
Assistant Examiner—Carl Whitehead, Jr.
Attorney, Agent, or Firm—Leydig, Voit & Mayer

[57] ABSTRACT

An optoelectronic integrated circuit includes a light responsive element for converting an optical signal into an electrical signal and an electronic circuit for processing the electrical signal. The light responsive element is disposed on a first surface of a substrate and includes p side electrodes and n side electrodes alternatingly arranged parallel to each other. The electronic circuit is disposed on a second surface of the substrate. The light responsive element is electrically connected to the electronic circuit by a via hole penetrating the substrate. In this structure, light incident on the first surface is almost completely absorbed by the substrate and hardly reaches the electronic circuit on the second surface. Therefore, variations in operation of the electronic circuit, such as an increase in drain current, are reduced. In addition, since the degree of freedom in arranging these elements on both surfaces of the substrate is increased, high-density integration is achieved, resulting in a small-sized IC chip.

8 Claims, 13 Drawing Sheets

F I G. 5(a)
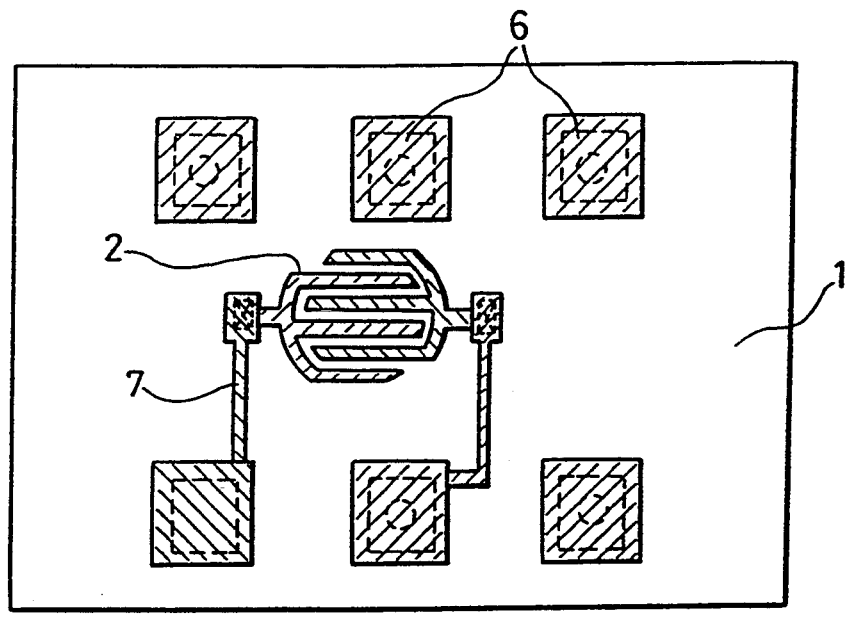
F I G. 5(b)
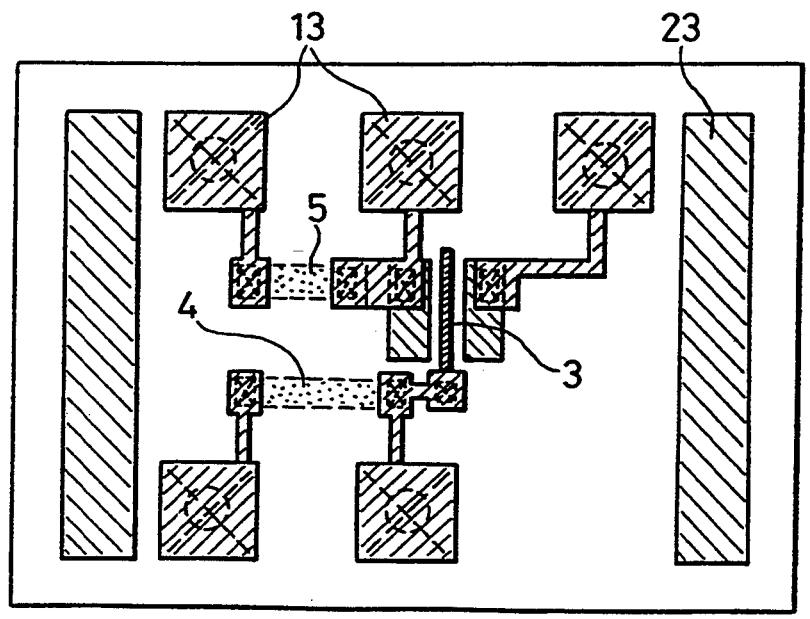

OPTOELECTRONIC INTEGRATED CIRCUIT

FIELD OF THE INVENTION

The present invention relates to an optoelectronic integrated circuit (hereinafter referred to as OEIC) in which signals generated by light-to-electricity conversion in a light responsive element are processed in a signal processing circuit and, more particularly, to an DE/C that reduces the light incident on elements other than the light responsive element.

BACKGROUND OF THE INVENTION

FIG. 11 is a sectional view showing a prior art OEIC. FIG. 12 schematically shows an equivalent circuit of FIG. 11. In the figures, reference numeral 1 designates a GaAs substrate approximately 100 microns thick. A photodiode 2, which converts incident light into electricity, is disposed on the GaAs substrate 1. The photodiode 2 comprises p+ layers 2c and n+ layers 2d formed in the surface region of the substrate 1 by ion implantation and p side electrodes 2a and n side electrodes 2b formed the p+ layers 2c and the n+ layers 2d, respectively. A field effect transistor (hereinafter referred to as FET) 3 is disposed on the GaAs substrate 1. The FET 3 is a preamplifier for an electronic circuit, which converts the current produced in the photodiode 2 into voltage signals and outputs the voltage signals.

The FET 3 is formed in the following process. First, an active layer 3c and source and drain ohmic contact layers 3d are formed in the surface region of the substrate 1 by ion implantation. Then, a gate metal is deposited on the entire surface of the substrate 1 and selectively etched away to form a gate electrode 3a. Source and drain ohmic electrodes 3b are formed on the source and drain ohmic contact layers 3d at opposite sides of the gate electrode 3a by a spacer lift-off method.

Insulating films 8a for protecting the surface of the substrate 1 are disposed on the substrate 1 where the gate electrode 3a, the ohmic electrodes 3b, and the electrodes 2a and 2b of the photodiode are absent. Interlayer insulating films 8b are disposed on the insulating films 8a.

In addition, a load resistance 4 of the photodiode 2 is connected to the p side electrode 2a of the photodiode 2. A load resistance 5 is connected to the drain electrode 3b of the FET 3. Reference numeral 6 designates a bonding pad for applying power to the photodiode 2 and the FET 3 or for taking out signals. A wiring 7a connects the p side electrode 2a of the photodiode 2 with the gate electrode 3a of the FET 3 and a wiring 7b connects the electrode 5a of the load resistance 5 with the drain electrode 3b of the FET 3. A protective film 9 is disposed on the entire surface of the wafer. A gold plating layer 10 is disposed on the rear surface of the substrate 1. When the IC chip is mounted on a package, the gold plating layer 10 is adhered to the package by solder or the like. Reference numeral 11 designates an optical fiber as a transmission medium and reference numeral 12 designates light from the optical fiber 11. FIGS. 10(a) and 10(b) are a top view and a bottom view of the OEIC shown in FIG. 11.

A description is given of the operation. When light 12 (an optical signal) having a wavelength of 0.85 micron strikes the photodiode 2 through the optical fiber 11, free holes and electrons are generated in the p+ layer 2c, the n+ layer 2d, and a depletion layer between the layers 2c and 2d The electrons in the p+ layer 2c and the holes in the n+ layer 2d flow into the depletion layer. The holes and electrons in the depletion layer drift toward the p+ layer 2c and the n+ layer 2d, respectively, and a photocurrent is generated in proportion to the intensity of the light. The photocurrent is taken out from the p side electrode 2a. The p side electrode 2a is connected to the gate electrode 3a of the FET 3 and the load resistance 4 of the photodiode 2 by the wiring 7a. When the current taken out from the p side electrode 2a flows into the load resistance 4, the current is converted to a voltage signal and input to the gate electrode 3a of the FET 3. Then, the voltage signal is amplified by the voltage amplifier comprising the FET 3 and the load resistance 5 and taken out from the bonding pad 6 serving as an output terminal.

In the above-described OEIC, the speed of response depends on a CR time constant which is the product of the sum of the capacitance of the photodiode and the input capacitance of the FET (capacitance C) and the load resistance of the photodiode (resistance R). With an increase in the quantity of information transmitted in optical communication, in order to realize a high speed and low noise OEIC, it is necessary to reduce the capacitance of the photodiode 2. A photodiode several tens of microns in diameter is effective to reduce the capacitance component of the photodiode. However, the diameter of the core of the optical fiber 11 through which light 12 is propagated is 10 to 50 microns and the light spreads wider than the diameter of the fiber because of diffraction at the end of the fiber. Therefore, if the precision of alignment between the fiber 11 and the photodiode 2 is poor, the light unfavorably strikes elements other than the photodiode 2. When the light strikes the active layer of the FET, carriers in the active layer are excited due to light-to-electricity conversion and the drain current of the FET unfavorably increases, resulting in a malfunction of the FET.

Meanwhile, FIG. 13 is a cross-sectional view of an OEIC described in Japanese Published Patent Application No. 61-135155. In FIG. 13, a PIN type diode 134 and an FET 135 are integrated on a semi-insulating GaAs substrate 121. More specifically, an n+ type GaAs layer 122, an n− type GaAs layer 123, and a high resistance AlGaAs layer 124 are successively disposed on the semi-insulating GaAs substrate 121 and a groove 133 separates the PIN type diode 134 from the FET 135. In the FET 135, an undoped GaAs layer 125 is disposed on the AlGaAs layer 124 and an n type GaAs layer 126 is disposed on the undoped GaAs layer 125. Source, drain, and gate electrodes are disposed on the n type GaAs layer 126. In the PIN type diode 134, a groove 136 is formed in the high resistance AlGaAs layer 124 and a p type region 128 is formed by diffusing zinc from the surface of the groove 136 to reach the n− type GaAs layer 123. P side electrodes 130 are disposed on the upper end surface of the p type layer 128 and connected to the gate electrode of the FET 135 by an aluminum wiring 131. An n side electrode 132 of the PIN diode 134 is disposed on the n+ type GaAs layer 122. Silicon nitride films 127 are disposed on the high resistance AlGaAs layer 124 where the p side electrodes 130 and the undoped GaAs layer 125 are absent.

Also in the structure of FIG. 13, light unfavorably strikes the FET 125. In order to prevent the light from being incident on the FET 125, the Japanese Published Patent Application No. 61-135155 proposes a structure shown in FIG. 14, in which an FET 113 and a PIN diode 114 are integrated on a semi-insulating GaAs substrate 105. In FIG. 14, a high resistance AlGaAs layer 104, an n⁻ type GaAs layer 103, an n type GaAs layer 102, and an n⁺ type GaAs layer 101 are successively disposed on the semi-insulating GaAs substrate 105. A gate electrode of the FET 113 is disposed on the n type GaAs layer 102 and source and drain electrodes are disposed on the n⁺ type GaAs layer 101 at opposite sides of the gate electrode. The FET 113 is separated from the PIN diode 114 by insulating regions 108. A groove 106 penetrates the substrate 105 to expose the high resistance AlGaAs layer 104 and a p type region 107 is formed by diffusing zinc from the surface of the groove 106. P side electrodes 110 of the PIN diode 114 are disposed on the upper end surface of the p type layer 107 and an n side electrode 109 is disposed on the n⁺ type GaAs layer 101. The n side electrode 109 is connected to the gate electrode of the FET 113 by an aluminum wiring 112.

In operation, an optical fiber is inserted in the groove 106 of the diode 114 to generate free electrons in the p type layer 107. The free electrons thus generated travel through the n⁻ GaAs layer 103, the n type GaAs layer 102, and the n⁺ type GaAs layer 101, so that carriers are transferred in a longitudinal direction and taken out from the n type electrode 109. Therefore, in order to provide a path for the carriers, it is necessary to separate the FET 113 from the PIN diode 114 by the insulating region 108, and a restriction is placed on the positional relation between the PIN diode 114 and the FET 113, that is, the degree of freedom in arranging these elements is decreased. As a result, high density integration is not achieved. In addition, since a laminated structure is employed, the production process is complicated, resulting in high costs.

SUMMARY OF THE INVENTION

It is an object of the present invention to provide an OEIC that places no restriction on the layout of elements when a light responsive element is disposed on a surface of one substrate and an electronic circuit element is disposed on the other surface of the substrate and that reduces light incident on the electronic circuit element.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to a first aspect of the present invention, an OEIC comprises a light responsive element disposed on a main surface of a substrate, an electronic circuit disposed on the opposite surface of the substrate, and a via hole electrically connecting the light receiving element to the electronic circuit. In this structure, since the substrate is thick, light incident on the surface where the light responsive element is present is almost totally absorbed by the substrate and hardly reaches the electronic circuit on the rear surface of the substrate. As the result, variations in the operation of the electronic circuit, such as an increase in drain current, are reduced. In addition, when the light responsive element and the electronic circuit are formed on the both surfaces of the substrate, no restriction is placed on the layout of these elements, whereby a reduction in chip size is achieved.

According to a second aspect of the present invention, an OEIC comprises a light responsive element disposed on a main surface of a first substrate and an electronic circuit disposed on a main surface of a second substrate. The first and second substrates are united by connecting rear surfaces of the respective substrates to each other. Therefore, even when the light responsive element and the electronic circuit, i.e., signal processing circuit, are formed on the different substrates, light incident on the electronic circuit is effectively reduced. In addition, various kinds of light responsive elements are produced.

BRIEF DESCRIPTION OF THE DRAWINGS

FIGS. 1(a)-1(b) are plan views of an OEIC in accordance with a first embodiment of the present invention, in which FIG. 1(a) is a top view and FIG. 1(b) is a bottom view;

FIGS. 5(a)-5(b) are plan views of an OEIC in accordance with a second embodiment of the present invention, in which FIG. 5(a) is a top view and FIG. 5(b) is a bottom view;

FIGS. 7(a)-7(b) are plan views of an OEIC in accordance with a third embodiment of the present invention, in which FIG. 7(a) is a top view and FIG. 7(b) is a bottom view;

FIGS. 10(a)-10(b) are plan views of a prior art OEIC, in which FIG. 10(a) is a top view and FIG. 10(b) is a bottom view;

DETAILED DESCRIPTION OF THE PREFERRED EMBODIMENTS

Figure 1A:
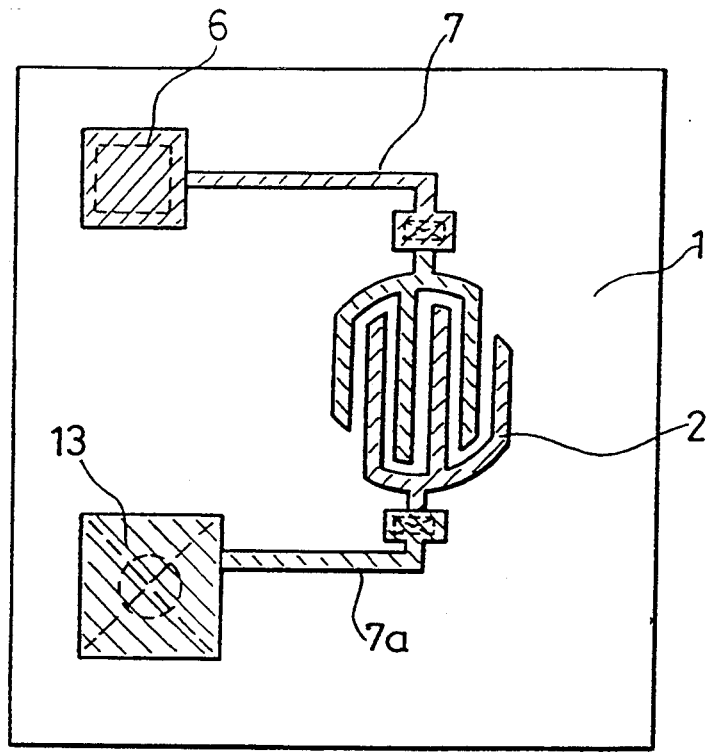
Figure 1B:
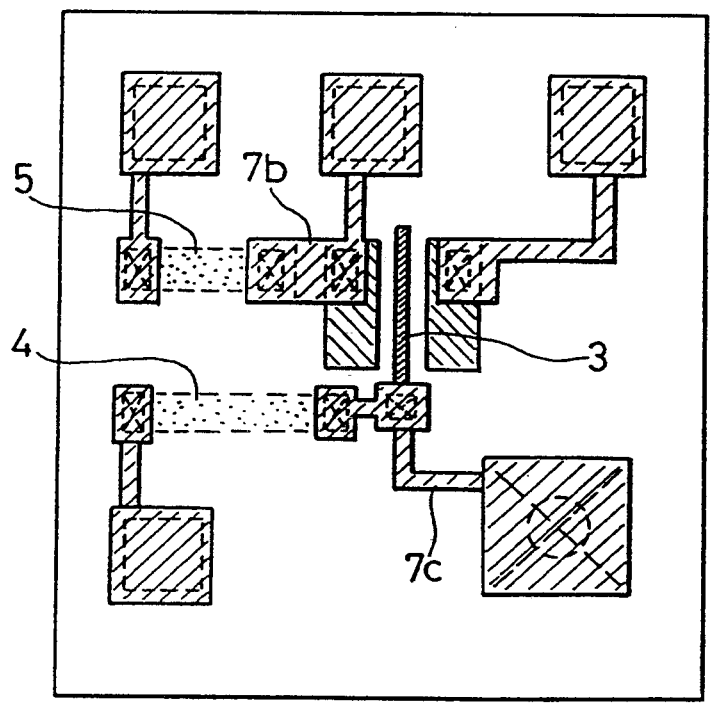
Figure 10A:
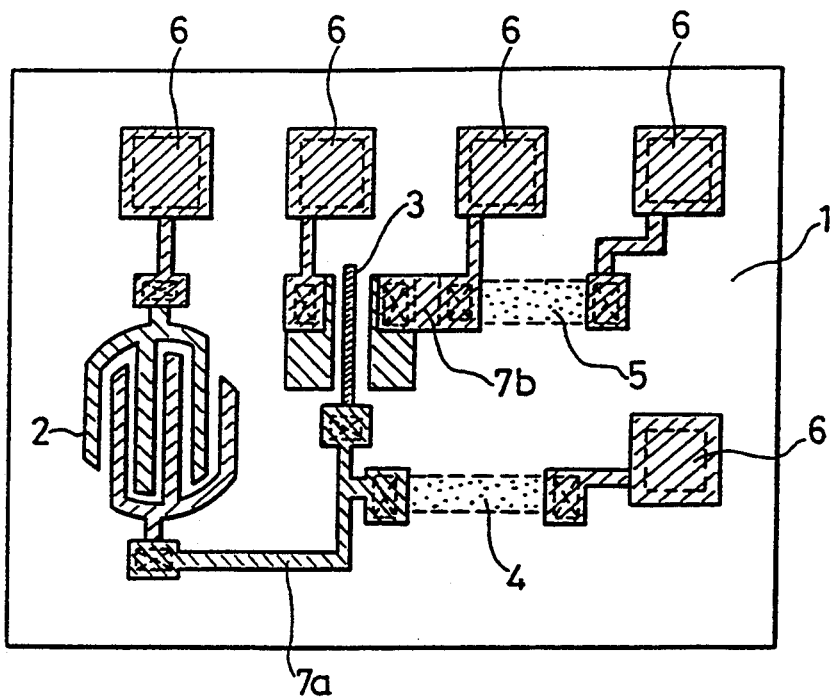
Figure 10B:
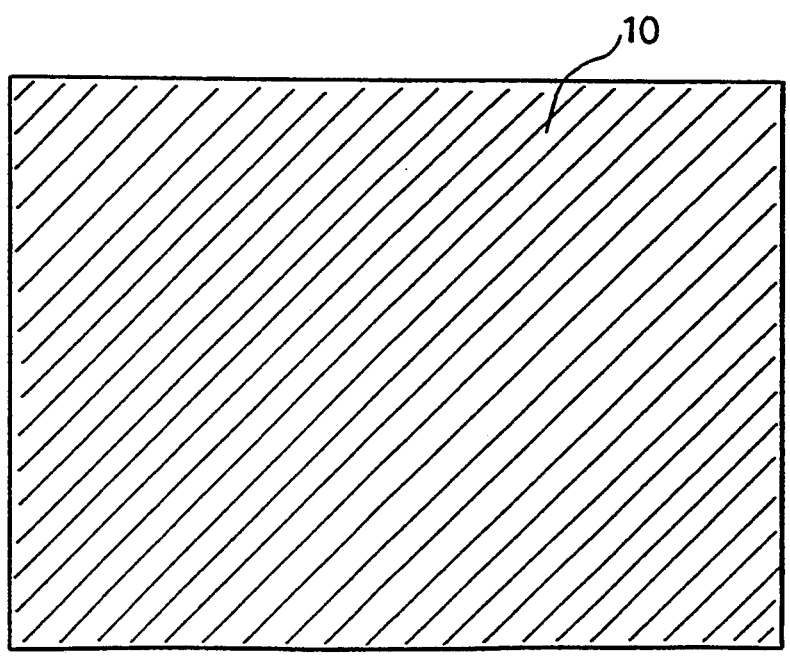
Figure 11:
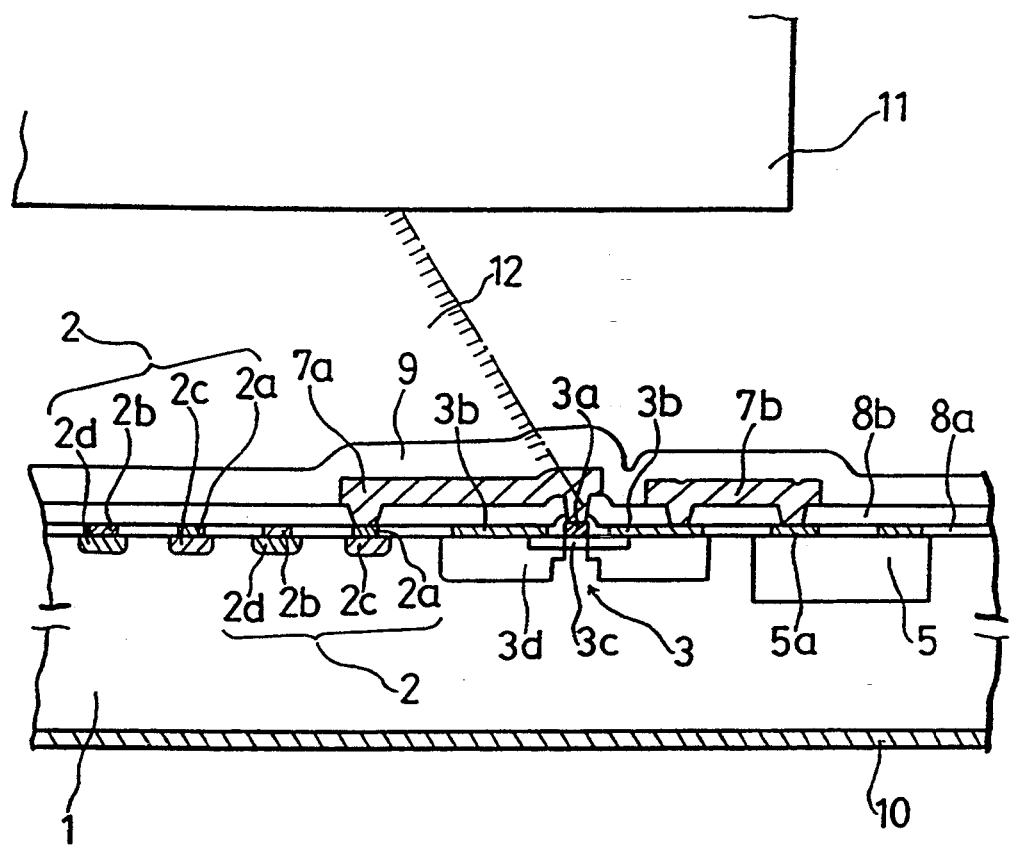
FIG. 11 is a sectional view of a part of the prior art OEIC shown in FIGS. 10(a)-10(b)
Figure 12:
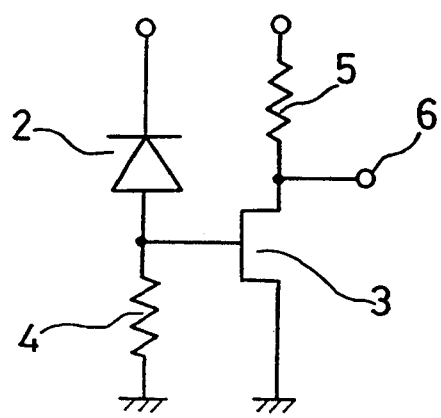
FIG. 12 is a schematic diagram of an equivalent circuit of the OEIC shown in FIG. 11.
Figure 13:
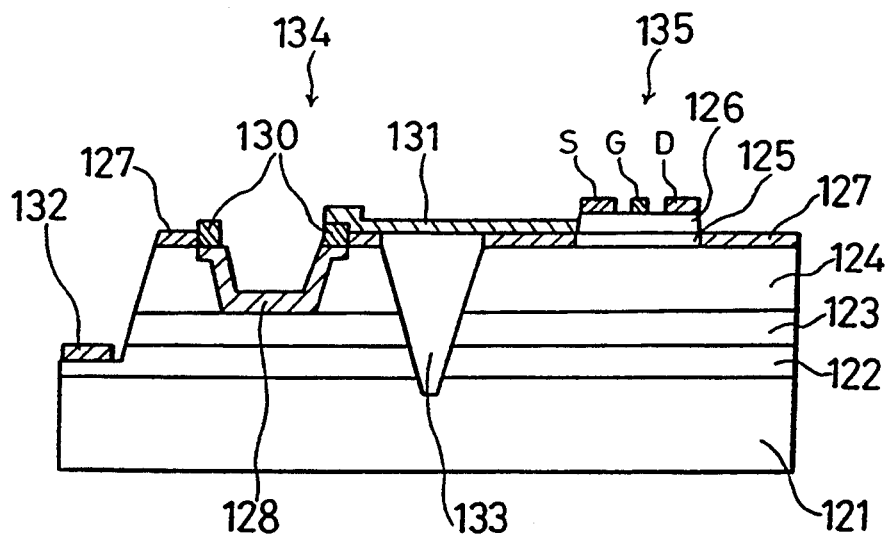
FIG. 13 is a sectional view of an OEIC according to the prior art.
Figure 14:
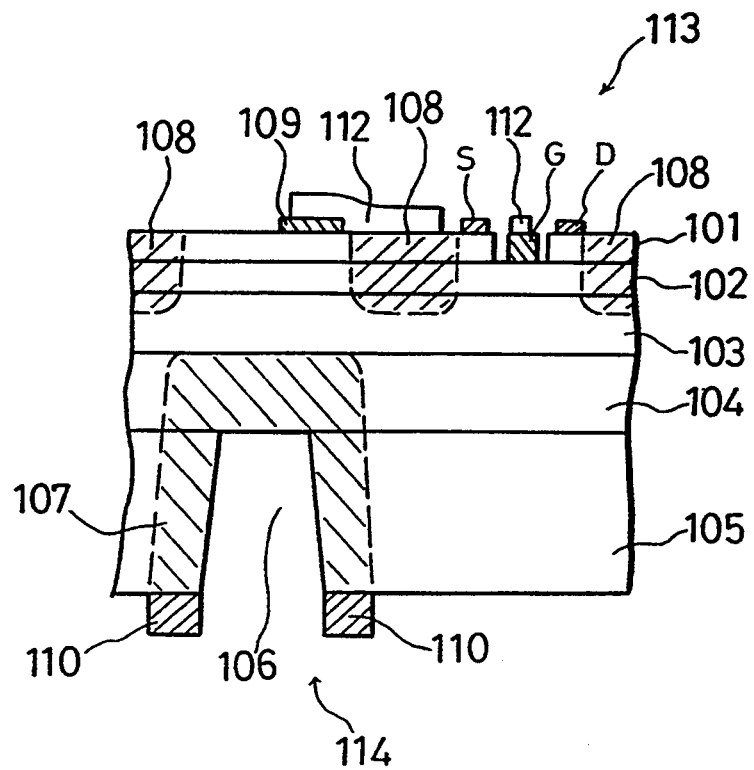
FIG. 14 is a sectional view of an OEIC according to the prior art.

FIGS. 1(a)-1(b) are plan views showing an OEIC in accordance with a first embodiment of the present invention, in which FIG. 1(a) is a top view and FIG. 1(b) is a bottom view. In the figures, the same reference numerals as in FIGS. 10(a)-10(b) designate the same or corresponding parts. A p side electrode and an n side electrode of the photodiode 2 are opposite to each other on the surface of the GaAs substrate 1 so that fingers of the p side electrode alternate with fingers of the n side electrode i.e., the electrodes are interdigitated. A via hole 13 connects the photodiode 2 to an FET 3 on the rear surface of the substrate 1 and a load resistance 4 of the photodiode. In the following description, the load resistance 4 will be omitted.

Figure 2:
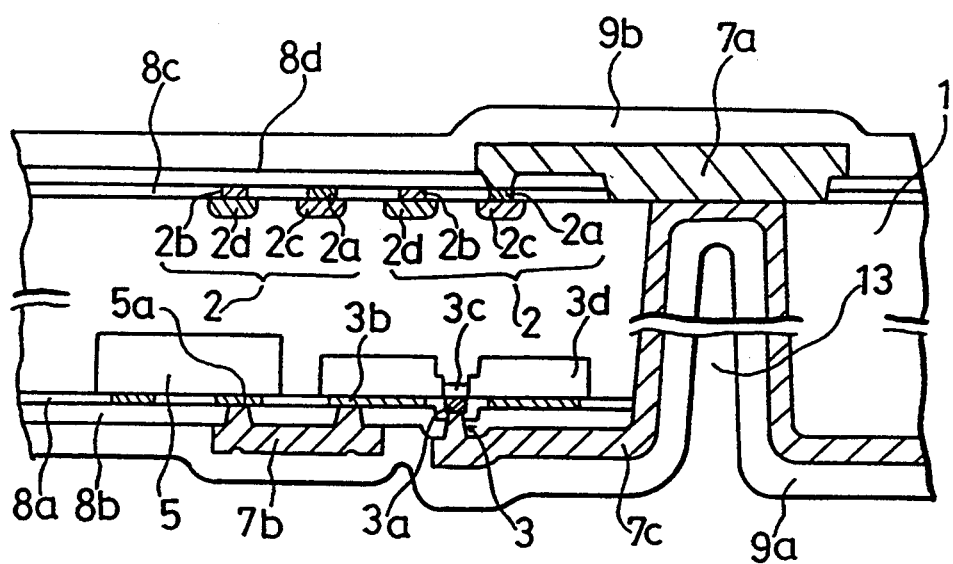
FIG. 2 is a sectional view of a part of the OEIC shown in FIGS. 1(a)-1(b)

FIG. 2 is a sectional view of a part of the OEIC shown in FIGS. 1(a)-1(b). However, FIG. 2 is one for explaining electrical connections of elements in the OEIC, so that it is different from an actual sectional view of FIGS. 1(a)-1(b) and elements in FIG. 2 do not exactly correspond to the elements in FIGS. 1(a)-1(b). FIGS. 3(a)-3(e) are sectional views of process steps in a method for producing the OEIC of FIG. 2.

A description is given of the production method.

Figure 3:
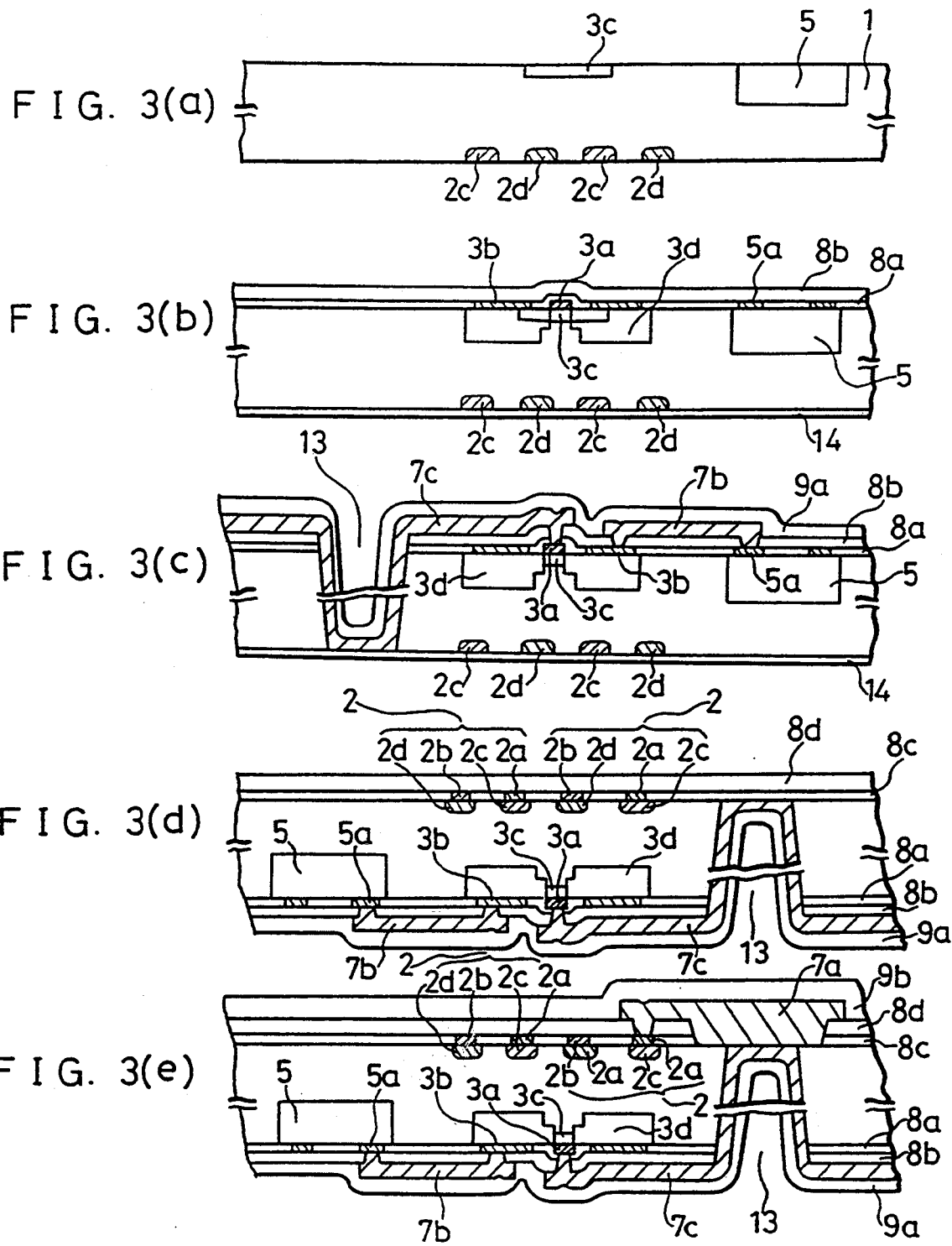
FIGS. 3(a) to 3(e) are sectional views of steps in a method for producing the OEIC shown in FIG. 2.

First, as shown in FIG. 3(a), ions are implanted into the GaAs substrate 1 about 100 microns thick from both surfaces, whereby p+ layers 2c and n+ layers 2d of the photodiode are formed on a main surface (hereinafter referred to as a first surface) of the substrate 1 and an active layer 3c of the FET and a resistance 5 are formed on the opposite surface (hereinafter referred to as a second surface). Then, as shown in FIG. 3(b), an insulating film 14 is deposited on the first surface of the substrate 1. Thereafter, a gate electrode 3a of the FET is deposited on the second surface of the substrate 1 and ions are implanted using the gate electrode 3a as a mask to form ohmic contact layers 3d self-alignedly with the gate electrode 3a. Then, an insulating film 8a is deposited on the second surface of the substrate and patterned to form ohmic electrodes 3b of the FET and ohmic electrodes 5a of the resistance 5. Thereafter, an insulating film 8b is deposited thereon.

Then, as shown in FIG. 3(c), a via hole 13 for connecting the photodiode 2 to the FET 3 is formed through the substrate 1 from the second surface by dry etching. At this time, the dry etching is carried out until the surface of the insulating film 14 is exposed at the bottom of the via hole 13. After patterning the insulating film 8b, wirings 7b and 7c are formed by gold plating. The wiring 7b connects the ohmic electrodes 5a of the resistance 5 to the ohmic electrodes 3b of the FET 3 and the wiring 7c connected to the gate electrode 3a of the FET 3 and covers the internal walls of the via hole 13. Since the insulating film 14 is present at the bottom of the via hole 13, the gold plating layer, i.e., the wiring 7c, is formed on the insulating film 14. Thereafter, a protective film 9a is formed on the entire surface.

The wafer is turned upside down and the insulating film 14 is removed. Then, an insulating film 8c is deposited thereon and patterned to expose the p+ layers 2c and the n+ layers 2d, and p side electrodes 2a and n side electrodes 2b are deposited on the p+ layers 2c and the n+ layers 2d, respectively. Thereafter, an insulating film 8d is deposited thereon and patterned into a prescribed shape. Then, a wiring 7a connecting the p side electrodes 2a to the wiring 7c in the via hole 13 is formed by gold plating, whereby the p side electrodes 2a of the photodiode 2 are electrically connected to the gate electrode 3a of the FET 3. Finally, a protective film 9b is formed on the entire surface, completing the structure of FIG. 3(e).

In operation, light having a wavelength of 0.85 micron incident on the photodiode 2, disposed on the surface of the substrate 1, is converted to a current. The current is taken out from the p side electrodes 2a of the photodiode 2 and input to the gate electrode 3a of the FET 3, disposed on the opposite surface of the substrate 1, through the wirings 7a and 7c. At this time, since the substrate 1 is as thick as 100 microns, light incident on elements other than the photodiode 2 is completely absorbed by the substrate 1 without reaching the active layer 3c of the FET 3 on the rear surface of the substrate, resulting in stable operation of the FET 3.

When the substrate reflection coefficient is R, absorption coefficient is a, and thickness is x, and the power of incident light is $P_{opt}$, the power of the light passing through the substrate is $$P_{opt} = (1-R)e^{-ax} \qquad (1)$$

Figure 15:
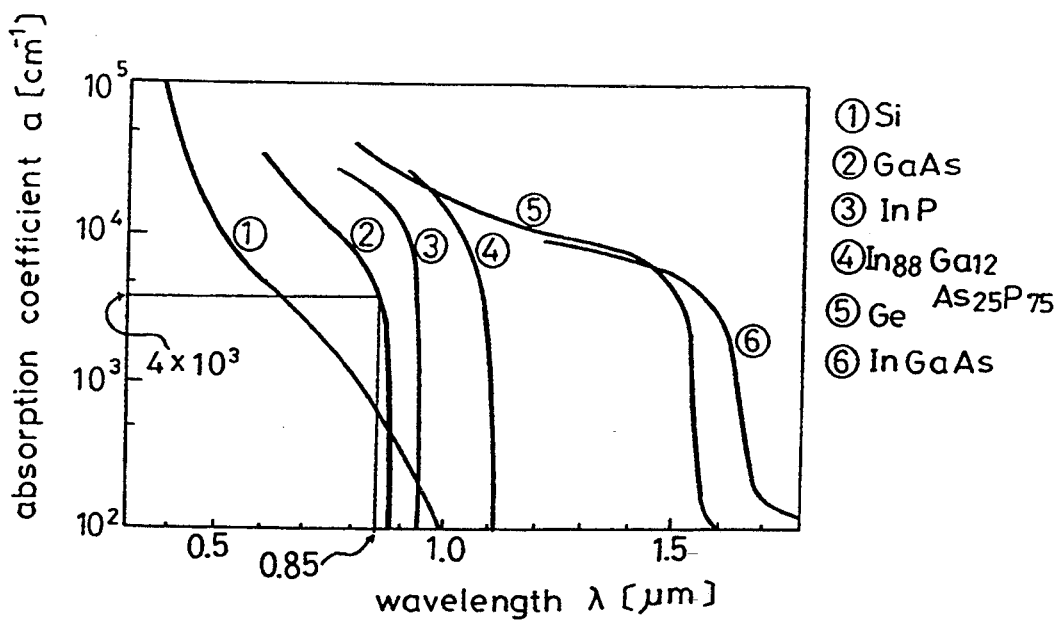
FIG. 15 is a graph showing absorption coefficients of various photodetectors at respective wavelengths.
Figure 16:
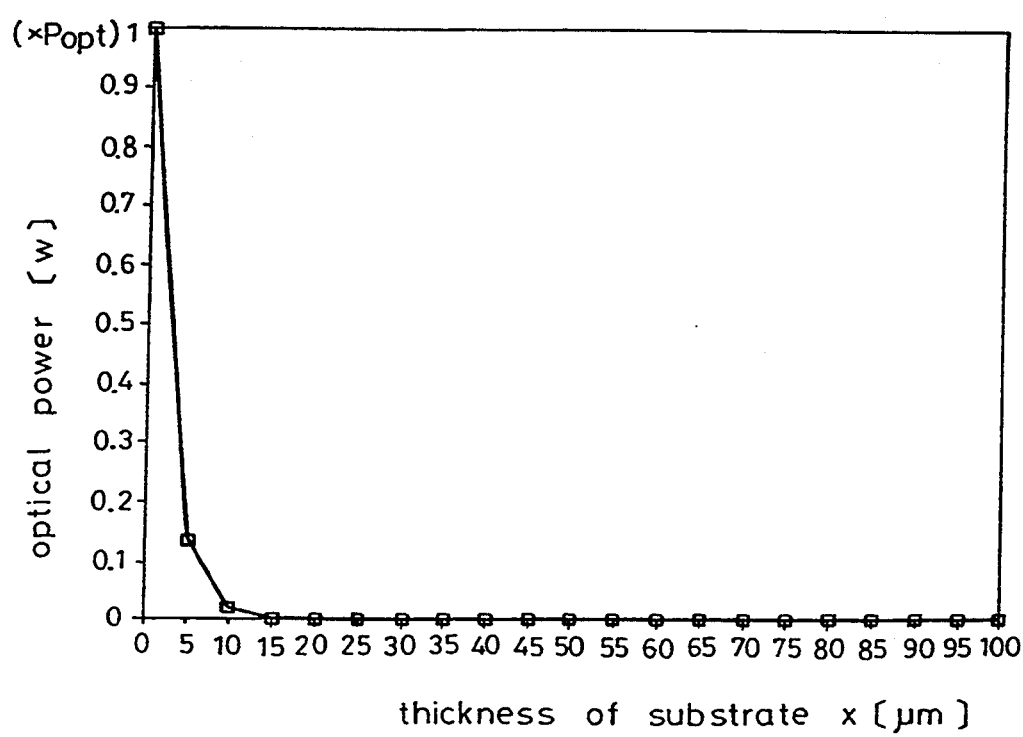
FIG. 16 is a graph showing the light absorption characteristic of a substrate.

FIG. 15 is a graph showing absorption coefficients of various semiconductor materials as a junction of wavelength. As shown in FIG. 15, the absorption coefficient a of GaAs to an optical signal having a wavelength λ of 0.85 micron is $4 \times 10^3$ cm$^{-1}$ ($4 \times 10^{-1}$ μm$^{-1}$). When this absorption coefficient is substituted for a in equation (1) and R is equal to 0, the absorption characteristic of the GaAs substrate to the optical signal is as plotted in FIG. 16. As shown in FIG. 16, an optical signal having short wavelength of 0.85 micron incident on the substrate is completely absorbed before it reaches a depth of about 20 microns from the surface of the substrate.

The current taken out from the p side electrodes 2a of the photodiode is transferred to the load resistance 4 through the wiring 7a and the wiring 7c in the via hole and converted to a voltage signal. The voltage signal is amplified by the voltage amplifier comprising the FET 3 and the load resistance 5 and taken out of the device from the bonding pad 6 as an output power.

Figure 4:
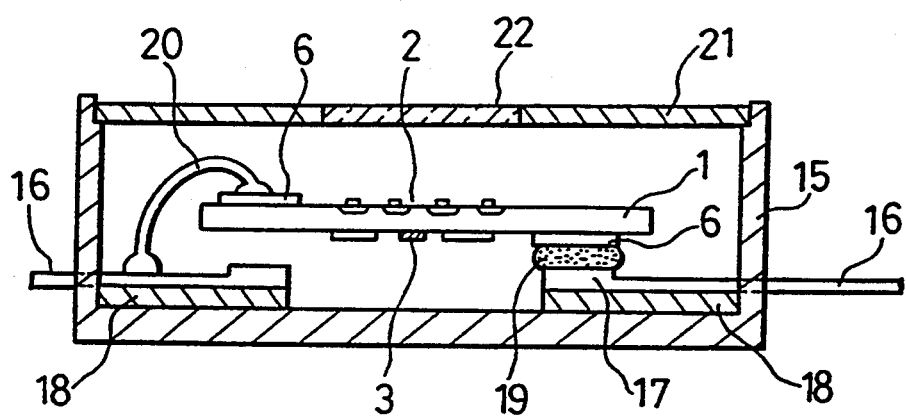
FIG. 4 is a sectional view of an IC package on which the OEIC shown in FIG. 2 is mounted.

The OEIC as described above is mounted on a package as illustrated in FIG. 4. In FIG. 4, reference numeral 15 designates the package. Lead terminals 16, for application of power and output of signals, are disposed on the package 15 via ceramic substrates 18 which insulate the lead terminals 16 from the package 15. An end of the lead terminal 16 extends out of the package 15 and a pad 17 is formed on the other end of the lead terminal 16. The pad 17 is connected to the bonding pad 6 on the rear surface of the IC chip by solder 19, whereby the IC chip is fixed in place. The thickness of the ceramic substrate 18 is selected so that the FET 3 on the rear surface of the IC chip may not come into contact with the base of the package 15. A bonding pad 6 on the surface of the IC chip 1 is connected to the lead terminal 16 by a wire 20. A lid 21 is disposed on the package 15 and a window 22 is set in the lid 21 above the photodiode 2.

While the bonding pads 6 are disposed on both sides of the substrate 1 in FIG. 4, the bonding pads 6 may be disposed on either surface of the substrate.

FIGS. 5(a)-5(b) are plan views of an OEIC in accordance with a second embodiment of the present invention, in which FIG. 5(a) shows a top plan view and FIG. 5(b) shows a bottom view. In this second embodiment, the bonding pads 6 for power application and output of signals are only disposed on the front surface of the substrate 1 and mount pads 23 for fixing the substrate 1 onto the package are disposed on the rear surface of the substrate. That is, the pads of the FET on the rear surface of the substrate are connected to the bonding pads 6 on the front surface of the substrate by via holes 13. Therefore, the positions of the pads are not restricted in designing the package, resulting in a greater degree of freedom in arranging the elements.

Figure 6:
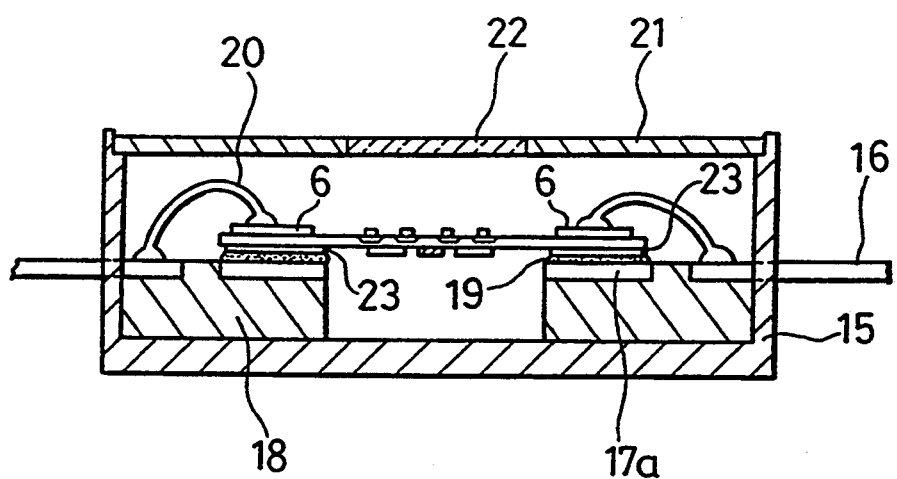
FIG. 6 is a sectional view of an IC package on which the OEIC shown in FIGS. 5(a)-5(b) is mounted.

The OEIC shown in FIGS. 5(a)-5(b) is mounted on a package as illustrated in FIG. 6. As shown in FIG. 6, the bonding pads 6 are connected to the lead terminals 16 by wires 20. When the IC chip is fixed onto the package 15, precise alignment is not required between the pads 23 on the rear surface of the IC chip and the pads 17a of the lead terminals 16, so that mounting is easily carried out.

Figure 7A:
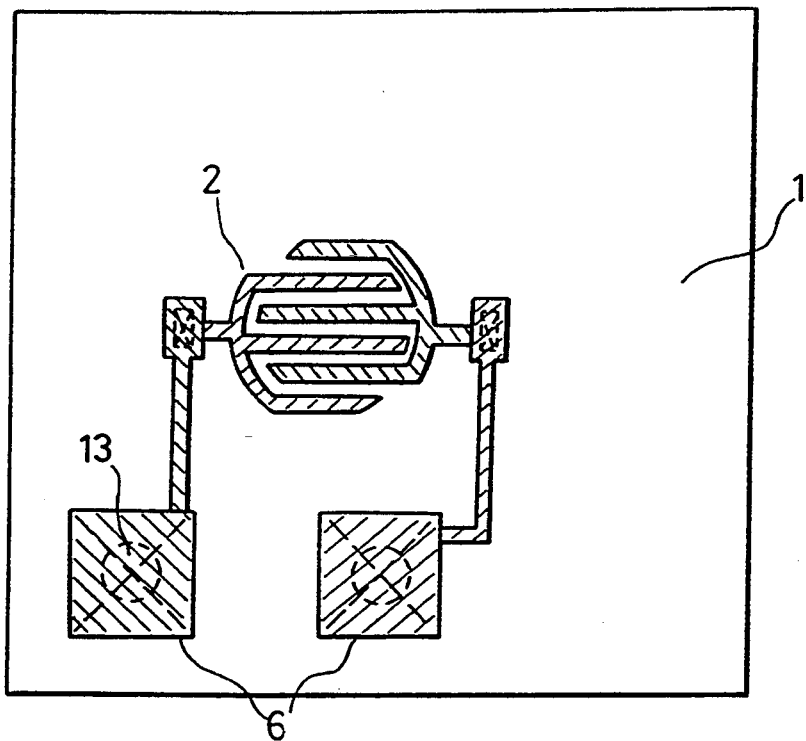
Figure 7B:
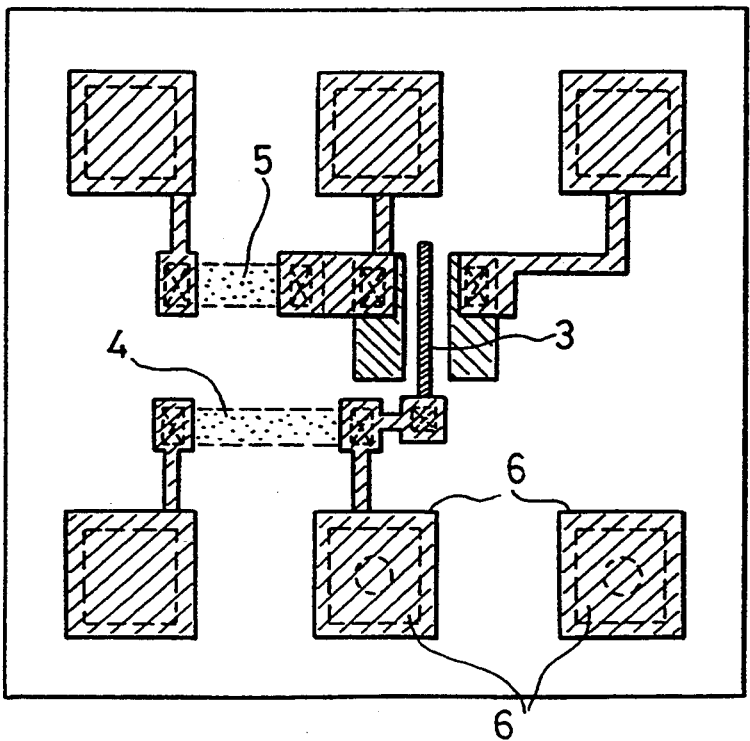
Figure 7C:
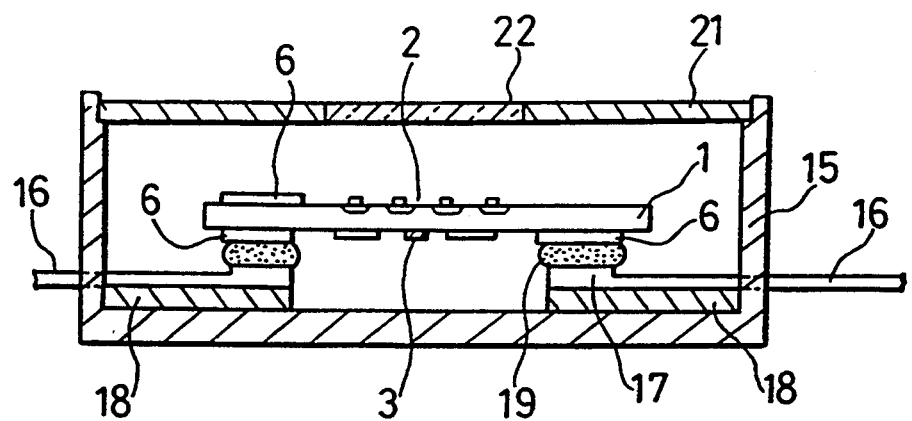
FIG. 7(c) is a sectional view of an IC package on which the OEIC shown in FIGS. 7(a)-7(b) is mounted.

FIGS. 7(a)-7(b) are plan views showing an OEIC in accordance with a third embodiment of the present invention, in which FIG. 7(a) shows a top plan view and FIG. 7(b) shows a bottom view. In this OEIC, all bonding pads 6 are disposed on the rear surface of the substrate. Pads of the photodiode 2 on the surface of the substrate are connected to the bonding pads 6 on the rear surface of the substrate by via holes 13. When this OEIC is mounted on a package, the bonding pads 6 on the rear surface of the substrate are directly connected to the lead terminals 16, so that the wire bonding process can be dispensed with and the fabrication is simplified.

According to the first to third embodiments of the present invention, the light responsive element (photodiode) 2 is disposed on a main surface of the GaAs substrate 1 and the electronic circuit (FET) 3 is disposed on the opposite surface of the substrate and these elements are connected to each other by the wirings 7a and 7c through the via hole 13. Therefore, light incident on the electronic circuit 3 is completely absorbed by the substrate. In addition, there is no restriction on the positioning of the light receiving element and the electronic circuit, i.e., the degree of freedom in layout of these elements is increased, resulting in a high-density integration OEIC.

While in the above-described first to third embodiments the substrate 1 comprises GaAs, the substrate 1 may comprise other semiconductor materials, for example, InP, silicon, or the like.

Although the window 22 is set in a part of the lid 21 in the above-described first to third embodiments, the package 15 may be covered with the window 22 because the FET 3 is present on the rear surface of the substrate. In this case, precise alignment between the IC chip and the lid is not required, resulting in easy fabrication.

Figure 8:
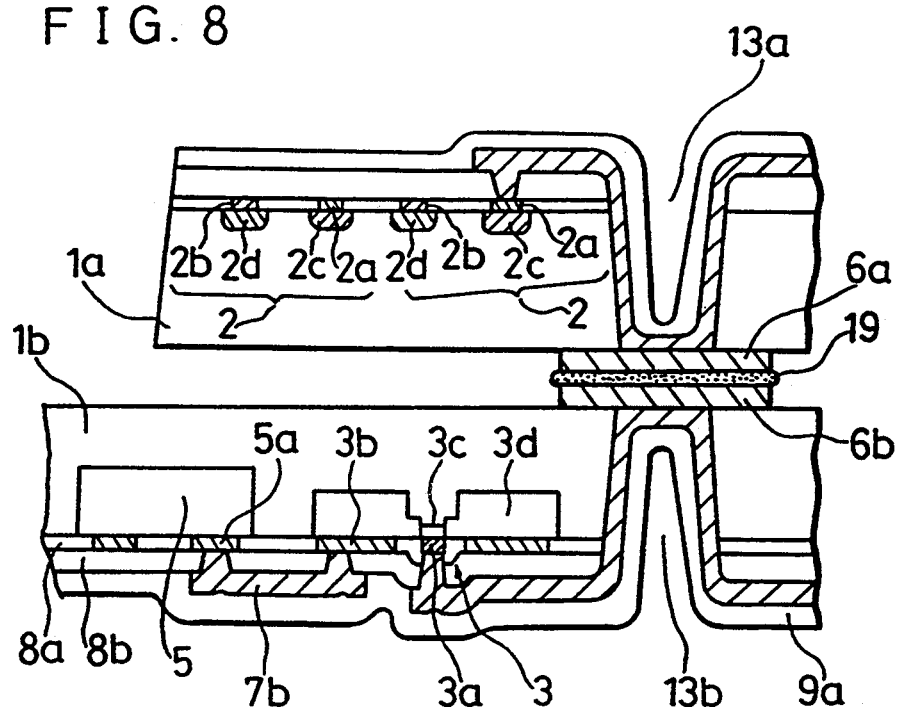
FIG. 8 is a sectional view of an OEIC in accordance with a fourth embodiment of the present invention.

FIG. 8 is a cross-sectional view of an OEIC in accordance with a fourth embodiment of the present invention. In this embodiment, a photodiode 2 and an FET 3 are disposed on different substrates 1a and 1b, respectively. Surfaces of the substrates 1a and 1b, on which these elements are absent, are opposed to each other and the photodiode 2 is electrically connected to the FET 3 by via holes 13a and 13b. More specifically, the via hole 13a is formed through the substrate 1a from the surface where the photodiode 2 is present and connects the photodiode 2 to a bonding pad 6a on the rear surface of the substrate 1a. The via hole 13b is formed through the substrate 1b from the surface where the FET 3 is present and connects the FET 3 to a bonding pad 6b on the rear surface of the substrate 1b. The bonding pads 6a and 6b are connected to each other by solder 19, whereby the photodiode 2 is electrically connected to the FET 3.

Figure 9A:
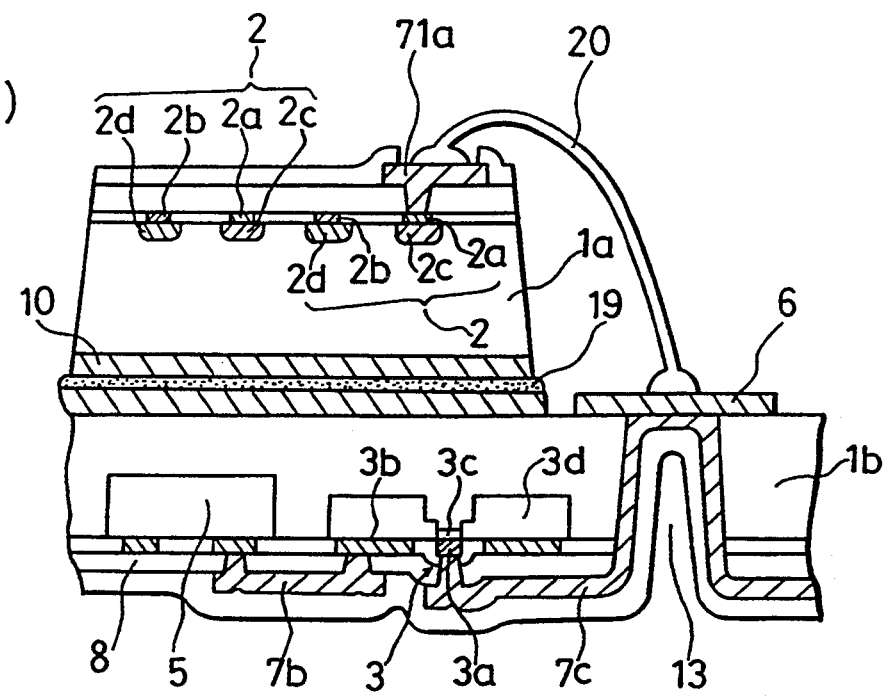
FIG. 9(a) is a sectional view of an OEIC in accordance with a fifth embodiment of the present invention.

FIG. 9(a) is a cross-sectional view of an OEIC in accordance with a fifth embodiment of the present invention. In this embodiment, a photodiode 2 is disposed on a substrate 1a while an FET 3 is disposed on a substrate 1b, and p side electrode 2a and of the photodiode 2 is connected to the gate electrode 3a of the FET 3. More specifically, gold plating layers 10 on the rear surfaces of the substrates 1a and 1b are connected by solder 19. The gate electrode 3a of the FET 3 is connected to a pad 6 through a via hole 13. A wiring 71a connected to the p side electrode 2a of the photodiode 2 is connected to the pad 6 by a wire 20.

Figure 9B:
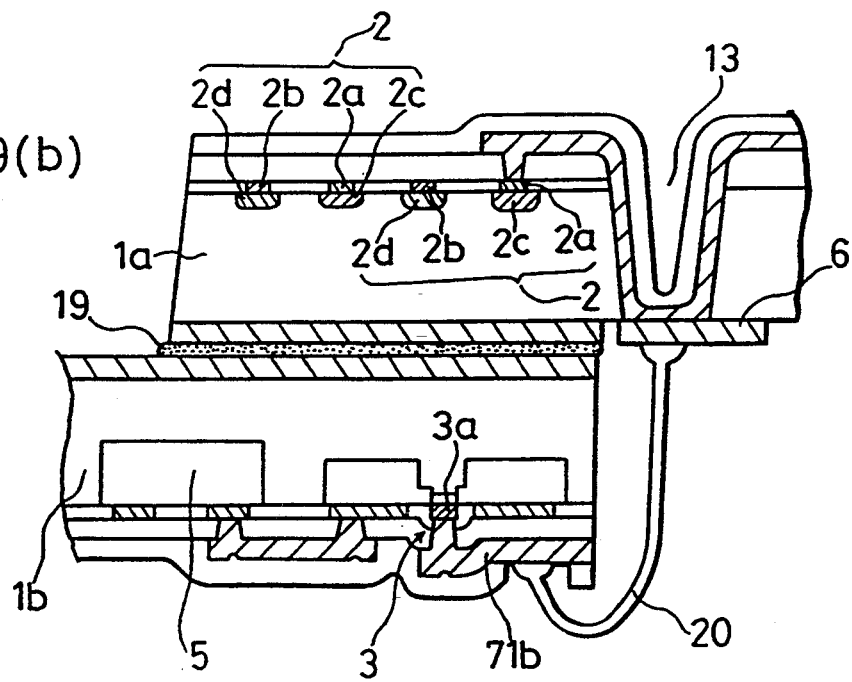
FIG. 9(b) is a sectional view showing a modification of the OEIC of FIG. 9(a)

FIG. 9(b) illustrates a modification of the OEIC shown in FIG. 9(a). In this modification, the p side electrode 2a of the photodiode 2 is connected to the pad 6 through the via hole 13. A wiring 71b connected to the gate electrode 3a of the FET 3 is connected to the pad 6 by the wire 20.

According to the fourth and fifth embodiments of the present invention, since the light responsive element (photodiode) and the electronic circuit (FET) are disposed on different substrates, light incident on the electronic circuit is reduced as in first to third embodiments of the present invention. In addition, various materials can be used for the substrates. For example, if silicon is used for the substrate of the light responsive element, a long wavelength light responsive element is realized. Thus, the degree of freedom in combining devices is increased.

As is evident from the foregoing description, according to the present invention, a light responsive element is disposed on a main surface of a substrate and an electronic circuit is disposed on the opposite surface of the substrate. The light responsive element is electrically connected to the electronic circuit by a via hole. Therefore, light incident on the surface where the light responsive element is present is almost completely absorbed by the substrate and hardly reaches the electronic circuit on the rear surface of the substrate. As the result, variations in operation of the electronic circuit, such as an increase in drain current, are reduced. In addition, since the degree of freedom in arranging these elements on both surfaces of the substrate is increased, a high-density of integration is achieved, resulting in a small-sized IC chip.

In addition, according to the present invention, a light responsive element is disposed on a main surface of a first substrate and an electronic circuit is disposed on a main surface of a second substrate. The first and second substrates are united by connecting rear surfaces of the respective substrates to each other. Therefore, even when the light responsive element and the electronic circuit, i.e., signal processing circuit, are formed on the different substrates, light incident on the electronic circuit is effectively reduced. In addition, since various materials are used for the substrates, various kinds of light responsive elements are produced and a degree of freedom in combining devices is increased.

What is claimed is:

1. An optoelectronic integrated circuit comprising:
   a semiconductor substrate having opposed first and second surfaces;
   a light responsive element for converting an optical signal into an electrical signal disposed on the first surface of the semiconductor substrate and including p side electrodes and n side electrodes alternatingly arranged;
   an electronic circuit for processing the electrical signal disposed on the second surface of the semiconductor substrate, the semiconductor substrate having a thickness so that light incident on the light responsive element is substantially completely absorbed by the semiconductor substrate before reaching the electronic circuit; and a via hole penetrating through the semiconductor substrate and electrically connecting the light responsive element to the electronic circuit.

2. An optoelectronic integrated circuit comprising:

a first semiconductor substrate having opposed first and second surfaces;

a second semiconductor substrate having opposed first and second surfaces;

a light responsive element for converting an optical signal into an electrical signal disposed on the first surface of the first semiconductor substrate; and an electronic circuit for processing the electrical signal disposed on the first surface of the second semiconductor substrate wherein said first and second semiconductor substrates are united at the second surfaces of the first and second semiconductor substrates and have thicknesses so that light incident on the light responsive element is substantially completely absorbed by the first and second semiconductor substrates before reaching the electronic circuit.

3. The optoelectronic integrated circuit of claim 2 comprising:

a first via hole penetrating through the first substrate electrically connected to the light responsive element;

a second via hole penetrating through the second substrate electrically connected to the electronic circuit; and solder connecting the first and second via holes to each other.

4. The optoelectronic integrated circuit of claim 2 comprising:

a via hole penetrating through the first substrate electrically corrected to the light responsive element; and a wire connecting said via hole to an electrode of the electronic circuit on the first surface of the second substrate.

5. The optoelectronic integrated circuit of claim 2 comprising:

a via hole penetrating through the second substrate electrically connected to the light responsive element; and a wire connecting said via holes to an electrode of the light responsive element disposed on the first surface of the first substrate.

6. The optoelectronic integrated circuit of claim 1 including a plurality of first bonding pads connected to the light responsive element and disposed on the first surface of the substrate a plurality of second bonding pads connected to the electronic circuit and disposed on the second surface of the substrate, and a package including lead terminals, wherein the second surface of the substrate is mounted on the package, the second bonding pads are connected to the lead terminals of the package with solder, and the first bonding pads are connected to lead terminals of the package with wires.

7. The optoelectronic integrated circuit of claim 6 including bonding members disposed on the second surface of the substrate wherein the second bonding pads connected to the electronic circuit on the second surface are led to the first surface through via holes, the substrate is mounted on the package with the second surface adjacent the package, the bonding members are fixed onto mount pads of the package, and the second bonding pads are connected to the lead terminals of the package by wires.

8. The optoelectronic integrated circuit of claim 6 wherein the first bonding pads connected to the light responsive element on the first surface of the substrate are led to the second surface by via holes, the substrate is mounted on the package with the second surface adjacent the package, and the first bonding pads members are connected to the lead terminals of the package by solder.

* * * * *

UNITED STATES PATENT AND TRADEMARK OFFICE
CERTIFICATE OF CORRECTION

PATENT NO. : 5,357,121
DATED : October 18, 1994
INVENTOR(S) : Miyashita et al.

It is certified that error appears in the above-indentified patent and that said Letters Patent is hereby corrected as shown below:

Column 9, line 40, change "corrected" to --connected--.

Signed and Sealed this

Seventh Day of February, 1995

Attest:

BRUCE LEHMAN

*Attesting Officer*  *Commissioner of Patents and Trademarks*